United States Patent
Tschirhart et al.

(10) Patent No.: US 9,882,492 B2
(45) Date of Patent: Jan. 30, 2018

(54) CONTROL OF ASYMMETRIC PARALLEL SYNCHRONOUS RECTIFIERS IN POWER CONVERTER TOPOLOGIES

(71) Applicant: Infineon Technologies Austria AG, Villach (AT)

(72) Inventors: Darryl Tschirhart, Torrance, CA (US); Benjamim Tang, Rancho Palos Verdes, CA (US)

(73) Assignee: Infineon Technologies Austria AG, Villach (AT)

( * ) Notice: Subject to any disclaimer, the term of this patent is extended or adjusted under 35 U.S.C. 154(b) by 43 days.

(21) Appl. No.: 14/961,982

(22) Filed: Dec. 8, 2015

(65) Prior Publication Data

US 2017/0163159 A1 Jun. 8, 2017

(51) Int. Cl.
*H02M 3/335* (2006.01)
*H03K 17/04* (2006.01)
*H02M 7/217* (2006.01)
*H02M 7/219* (2006.01)

(52) U.S. Cl.
CPC ... *H02M 3/33507* (2013.01); *H02M 3/33592* (2013.01); *H03K 17/04* (2013.01); *H02M 7/217* (2013.01); *H02M 7/219* (2013.01)

(58) Field of Classification Search
CPC ....... H02M 3/335; H02M 7/217; H02M 7/219
See application file for complete search history.

(56) References Cited

U.S. PATENT DOCUMENTS

| | | | |
|---|---|---|---|
| 5,239,255 A * | 8/1993 | Schanin | G05F 1/455 323/237 |
| 5,616,945 A | 4/1997 | Williams | |
| 6,930,473 B2 * | 8/2005 | Elbanhawy | H02M 3/1584 323/282 |
| 9,350,262 B1 * | 5/2016 | Hsiao | H02M 7/217 |

OTHER PUBLICATIONS

"UCD3138 Highly Integrated Digital Controller for Isolated Power", Data Manual, Texas Instruments, Literature No. SLUSAP2F, Mar. 2012, Revised Nov. 2013, pp. 1-78.
Abdel-Rahman, Osama et al., "Analysis and Design of Voltage Regulator With Adaptive FET Modulation Scheme and Improved Efficiency", IEEE Transactions on Power Electronics, vol. 23, No. 2, Mar. 2008, pp. 896-906.

* cited by examiner

*Primary Examiner* — Jue Zhang
*Assistant Examiner* — Lakaisha Jackson
(74) *Attorney, Agent, or Firm* — Murphy, Bilak & Homiller, PLLC

(57) ABSTRACT

A power converter includes an input power source, a synchronous rectifier and a controller. The synchronous rectifier includes a plurality of actively controlled switches coupled in parallel and configured to rectify current delivered from the input power source to a load. The controller is operable to issue a first control signal for driving a first one of the actively controlled switches and issue a second control signal for driving a second one of the actively controlled switches. The first control signal is a different control signal than the second control signal so that the first actively controlled switch is controllable separately from the second actively controlled switch. The first actively controlled switch has a higher current-carrying capacity than the second actively controlled switch.

29 Claims, 14 Drawing Sheets

| Load | Large Switch | Small Switch |
|---|---|---|
| 100% | Full | D/2 |
| 90% | Full | D/2 |
| 80% | Full | D/2+10% |
| 70% | Full | D/2+30% |
| 60% | Full or Off | D/2+50% |
| 50% | Full or Off | D/2+60% |
| 40% | Full or Off | D/2+75% |
| 30% | Full or Off | D/2+85% |
| 20% | OFF | Full |
| 10% | OFF | Full |
| 5% | OFF | D/2 |

Figure 8

CONTROL OF ASYMMETRIC PARALLEL SYNCHRONOUS RECTIFIERS IN POWER CONVERTER TOPOLOGIES

TECHNICAL FIELD

The present application relates to power converters, in particular control of parallel synchronous rectifiers in power converters.

BACKGROUND

To achieve high rectification efficiency at full-load, multiple power transistors are connected in parallel in a single synchronous rectifier (SR) location to effectively reduce the SR resistance by a factor of the number of transistor in parallel. For example, three transistors in parallel have an equivalent on resistance equal to ⅓rd of a single device. However, the trade-off associated with paralleling multiple devices is a penalty in light-load efficiency as the gate loss increases by a factor of the number of devices in parallel. In the previous example, three devices in parallel have three times the gate loss of a single device. At light load (low power), gate loss dominates, and at full-load (high power) conduction loss dominates, so a trade-off inevitably exists. In the case of power converters having a center-tap secondary winding, the voltage stress is greater than the reflected input voltage. Therefore, the SRs require higher voltage rating with higher gate charge than lower voltage devices with equivalent on-resistances.

Realistically, the higher voltage parts have higher gate charge and higher on-resistance, exacerbating the need for parallel devices and increasing the light-load efficiency penalty. Using parallel transistors in place of a single device is common practice to increase the current handling capability of a power converter. However, the devices are typically symmetric and driven by the same signal. One approach uses FET modulation, where the sizes of FETs and gate drive voltage are modulated according to load so as to improve efficiency across the load range for non-isolated DC/DC converters. At light load, a small FET is used with low gate drive to reduce capacitive-related losses that dominate at that load range. As the load increases, the FET size increases along with gate drive voltage to minimize conduction losses which form the dominant loss mechanism at mid-high current. This concept was extended to isolated topologies where symmetric synchronous rectifiers were used in parallel. As the load reduces, the parallel synchronous rectifiers are turned off, and the gate drive voltage applied to the remaining SRs is reduced. There are a couple of disadvantages to this approach. First, gate voltage adjustment usually provides power savings for the converter, but not the system. The losses incurred by the gate voltage supply typically equal the savings experienced by the power converter. So in real systems, it is not worth the effort. Second, the use of symmetric FETs limits the achievable light-load efficiency as the SRs are typically large die (chips).

Existing solutions adjust the conduction time of the synchronous rectifiers depending on load. In one case, synchronous rectifiers conduct during both the energy transfer and freewheeling intervals of the switching cycle at high load conditions where energy transfer current is the current associated with one or more primary-side devices connecting the input voltage to the transformer primary so as to transfer energy from the source to the load. Freewheeling current is the current pulled through the synchronous rectifiers by the filter inductor while all primary-side devices are off. As the load reduces, the synchronous rectifiers only conduct the energy transfer current while the body diodes conduct the freewheeling current. At even lighter load, the synchronous rectifiers remain off and the body diodes conduct all current. There are two energy transfer intervals per cycle (positive and negative), and their sum represents the duty cycle according to $$D = \frac{t_{on+} + t_{on-}}{T_{sw}}$$

where ton is the on-time of the appropriate primary-side devices to create the voltage incident $V_{AB}$ on the transformer primary for the positive and negative half cycles indicated by the + and − symbols, respectively, and Tsw is the switching period. The freewheeling intervals occur when $V_{AB}$ is zero yet the current in the SRs is non-zero. The sum of freewheeling time per switching period represents 1-D. If parallel devices are used with the second conventional solution described above, the converter will have worse light-load performance than the first conventional solution described above because the second solution cannot turn individual devices off.

SUMMARY

According to an embodiment of a synchronous rectifier circuit, the synchronous rectifier circuit comprises a plurality of actively controlled switches coupled in parallel and a plurality of gate drivers each having an input terminal for receiving a control signal and an output terminal coupled to a gate of one of the actively controlled switches. Each gate driver is configured to drive the actively controlled switch coupled to its output terminal responsive to the control signal received at its input terminal. The synchronous rectifier circuit also comprises a controller operable to provide a first control signal to a first one of the gate drivers and provide a second control signal to a second one of the gate drivers, the first control signal being a different control signal than the second control signal so that the actively controlled switch driven by the first gate driver is controllable separately or independently from the actively controlled switch driven by the second gate driver.

According to an embodiment of a power converter, the power converter comprises an input power source, a synchronous rectifier and a controller. The synchronous rectifier comprises a plurality of actively controlled switches coupled in parallel and configured to rectify current delivered from the input power source to a load. The controller is operable to issue a first control signal for driving a first one of the actively controlled switches and issue a second control signal for driving a second one of the actively controlled switches. The first control signal is a different control signal than the second control signal so that the first actively controlled switch is controllable separately or independently from the second actively controlled switch. The first actively controlled switch has a higher current-carrying capacity than the second actively controlled switch. The power converter can be a resonant or non-resonant converter, and can have an isolated or non-isolated topology.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 8 illustrates an embodiment in which the controller of the power converter shown in FIG. 1 modulates the on-time of the synchronous rectifier actively controlled switches according to the load conditions.

DETAILED DESCRIPTION

Embodiments described herein increase rectification efficiency of an isolated or non-isolated supply, by providing separate control signals to the actively controlled switches connected in parallel in a synchronous rectifier circuit. By issuing separate control signals, asymmetric devices can be safely used in parallel. For example, a small power transistor in parallel with a large power transistor can be used without damaging the small transistor. A synchronous rectifier circuit with such a configuration achieves higher low-to-mid load efficiency over standard synchronous rectifier implementations.

Figure 1:
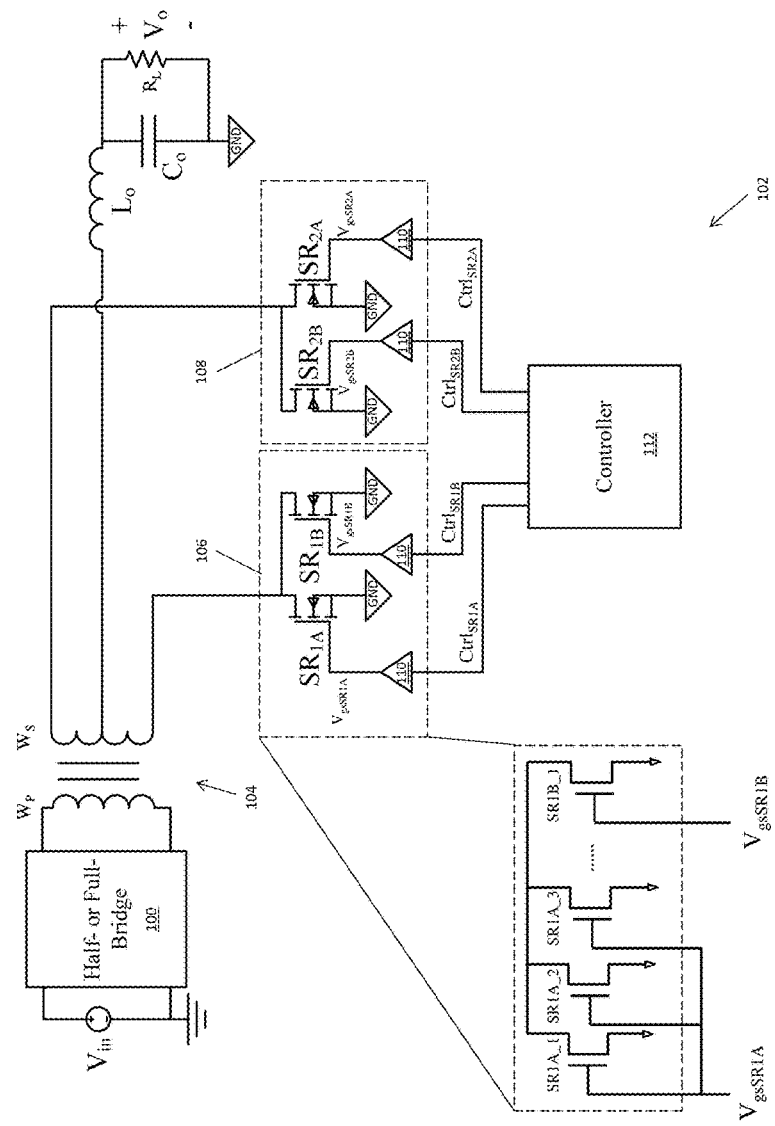
FIG. 1 illustrates a block diagram of an embodiment of a power converter having an asymmetric synchronous rectifier design.

FIG. 1 illustrates an embodiment of a power converter for supplying a load through an output inductor $L_O$ and output capacitor $C_O$. The load is generically illustrated in FIG. 1 as a resistor $R_L$. The power converter comprises an input power source, illustrated as a half or full bridge circuit 100 coupled to a DC source Vin, and a synchronous rectifier circuit 102 for rectifying current delivered from the input power source to the load. The exemplary power converter shown in FIG. 1 has an isolated topology in that the converter includes a transformer 104 for isolating the input power source from the load. The half or full bridge circuit 100 is coupled to the primary winding $W_P$ of the transformer 104, and the synchronous rectifier circuit 102 is coupled to the secondary winding $W_S$ of the transformer 104.

The synchronous rectifier circuit 102 comprises a synchronous rectifier 106, 108 for each positive and negative branch of the power converter. The first synchronous rectifier 106 is configured to rectify the positive cycle current at the secondary side of the transformer 104, and the second synchronous rectifier 108 is configured to rectify the negative cycle current. Each synchronous rectifier 106, 108 has a plurality of actively controlled switches $SR_{N/M}$ coupled in parallel. For purely illustrative purposes, the first (positive cycle) synchronous rectifier 106 is shown with two actively controlled switches $SR_{1A}/SR_{1B}$ coupled in parallel and the second (negative cycle) synchronous rectifier 108 is similarly shown with two actively controlled switches $SR_{2A}/SR_{2B}$ coupled in parallel.

The synchronous rectifier circuit 102 further comprises a plurality of gate drivers 110 and a controller 112. Each gate driver 110 has an input terminal for receiving a control signal $Ctrl_{SRN/M}$ from the controller 112 where N indicates the synchronous rectifier branch (positive or negative cycle in this example) and M indicates the particular actively controlled switch in branch N, and an output terminal coupled to the gate of one of the actively controlled switches $SR_{N/M}$. Each gate driver 110 is configured to drive the actively controlled switch $SR_{N/M}$ coupled to its output terminal via a gate drive signal $V_{gsSRN/M}$ which corresponds to the control signal received at its input terminal.

For each synchronous rectifier 106, 108, the controller 112 is operable to provide a different control signal $Ctrl_{SRN/M}$ to each gate driver 110 associated with one of the actively controlled switches $SR_{N/M}$ for that synchronous rectifier 106, 108. The control signals $Ctrl_{SRN/M}$ provided by the controller 112 are different so that each actively controlled switch $SR_{N/M}$ driven by one of the gate drivers 110 is controllable separately or independently from the other actively controlled switches $SR_{N/M}$. In the example shown in FIG. 1, this means that actively controlled switch $SR_{1A}$ of the first (positive cycle) synchronous rectifier 106 is controllable separately or independently from actively controlled switch $SR_{1B}$ of the same synchronous rectifier 106 even though these two actively controlled switches $SR_{1A/1B}$ are coupled in parallel. Similarly, actively controlled switch $SR_{2A}$ of the second (negative cycle) synchronous rectifier 108 is controllable separately or independently from actively controlled switch $SR_{2B}$. The actively controlled switches $SR_{N/M}$ of each synchronous rectifier 106, 108 also have different current-carrying capacities so that some switches can handle more output current than others.

The current-carrying asymmetry can be achieved in different ways. In one embodiment, each actively controlled switch $SR_{N/M}$ of one synchronous rectifier 106/108 comprises a power transistor die and the power transistor dies have different current ratings. This way, one power transistor die can handle more output current than another power transistor die of the same synchronous rectifier 106/108 even though the transistor dies are coupled in parallel. Alternatively, the larger actively controlled switches $SR_{N/A}$ and the smaller actively controlled switches $SR_{N/B}$ of the same synchronous rectifier 106/108 can be integrated into the same (single) semiconductor die to realize an integrated power stage for that rectifier 106/108.

In another embodiment, each actively controlled switch $SR_{N/M}$ of one synchronous rectifier 106/108 comprises one or more transistors in parallel. One of the actively controlled switches $SR_{N/M}$ of that synchronous rectifier 106/108 has fewer transistors coupled in parallel than the other actively controlled switch(es) $SR_{N/M}$ of that synchronous rectifier 106/108. For example in FIG. 1, actively controlled switch $SR_{1A}$ of the first (positive cycle) synchronous rectifier 106 is shown with at least three transistors SR1A_1, SR1A_2, SR1A_3 coupled in parallel and controlled by the same gate drive signal $V_{gsSR1A}$, and actively controlled switch $SR_{1B}$ of the first synchronous rectifier 106 is shown with a single transistor SR1B_1 controlled by gate drive signal $V_{gsSR1B}$. Still other transistor arrangements can yield asymmetric current-carrying capability for each synchronous rectifier 106, 108. In general, the actively controlled switches $SR_{N/A}$ labelled with an 'A' are larger devices with lower on-state resistance Rds, higher current-carrying capacity and higher gate charge Qg. The actively controlled switches $SR_{N/B}$ labelled with a 'B' are smaller devices with higher on-state resistance Rds, lower current-carrying capacity and lower gate charge Qg. Although only two actively controlled switches $SR_{N/M}$ are in parallel per synchronous rectifier (SR) location in FIG. 1, the asymmetric design approach easily scales to more than two actively controlled switches $SR_{N/M}$ in parallel per SR location. A synchronous rectifier circuit having such asymmetric characteristics achieves higher low-to-mid load efficiency over standard synchronous rectifier implementations.

Figure 2:
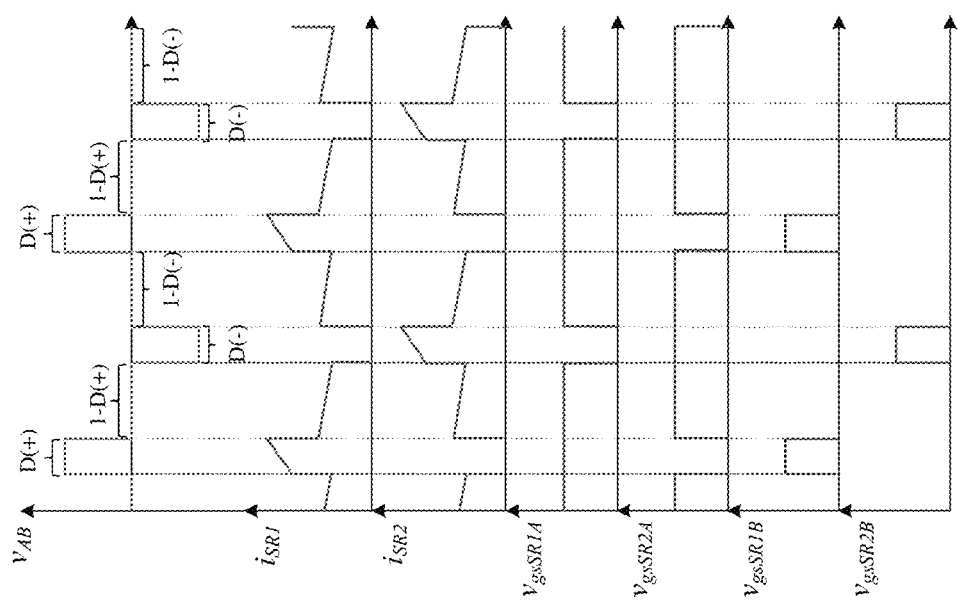
FIG. 2 illustrates various waveforms associated with operation of the power converter shown in FIG. 1 during full power conditions at the load, according to a first control embodiment.
Figure 3:
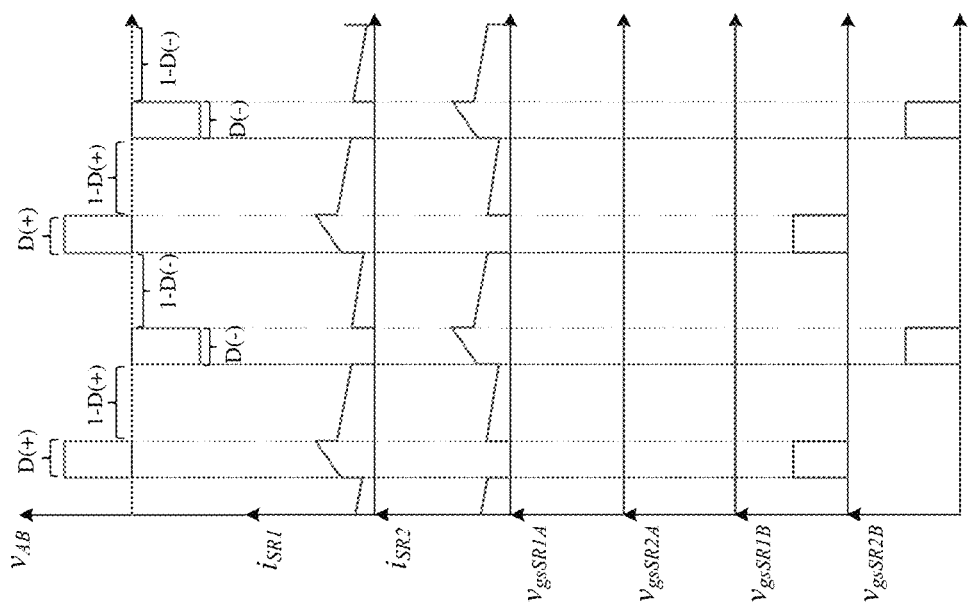
FIG. 3 illustrates various waveforms associated with operation of the power converter shown in FIG. 1 during low power conditions at the load, according to the first control embodiment.

FIGS. 2 and 3 illustrate various waveforms associated with operation of the power converter shown in FIG. 1. FIG. 2 shows the waveforms during full power conditions at the load, and FIG. 3 shows the same waveforms during low power conditions at the load or so-called light-load conditions. The power converter has asymmetric actively controlled switches $SR_{N/M}$ used in parallel to implement the respective synchronous rectifiers 106, 108 as discussed above. At light load conditions, the smaller actively controlled switch $SR_{N/B}$ of each synchronous rectifier 106, 108 conducts to offer lower rectification loss than standard converters with symmetric actively controlled switches coupled in parallel. The control signals $Ctrl_{SRN/M}$ provided by the controller 112 are not identical for the parallel-coupled switches $SR_{N/M}$ of each synchronous rectifier 106, 108. FIGS. 2 and 3 show the corresponding gate drive signals $V_{gsSRN/M}$ applied to the gates of the actively controlled switches $SR_{N/M}$, the voltage $V_{AB}$ across the secondary winding of the transformer 104, and the current $i_{SR1}$, $i_{SR2}$ rectified by the respective synchronous rectifiers 106, 108.

Each switching cycle of each synchronous rectifier 106, 108 includes an energy transfer interval (D) during which energy is transferred from the primary winding to the secondary winding of the transformer 104 and a freewheeling interval (1-D) during which the input power source is disconnected from the secondary side. This occurs for both the positive (+) and negative (−) cycle of the current being rectified. The controller 112 activates the control signal $Ctrl_{SR1,2A}$ for each larger actively controlled switch $SR_{N/A}$ of the respective synchronous rectifiers 106, 108 for both the energy transfer interval and the freewheeling interval of the corresponding positive/negative cycle during full power conditions at the load. This way, each larger actively controlled switch $SR_{N/A}$ is on for the entire positive or negative half of the switching cycle. The controller 112 activates the control signal $Ctrl_{SR1/2B}$ for each smaller actively controlled switch $SR_{N/B}$ of the respective synchronous rectifiers 106, 108 for part or all of the energy transfer interval and none of the freewheeling interval of the corresponding positive/negative cycle during the full power conditions at the load.

In one embodiment, the controller 112 activates $Ctrl_{SR1/2B}$ at the beginning of the energy transfer interval and deactivates $Ctrl_{SR1/2B}$ at the end of the energy transfer interval during the full power conditions at the load. This full power control technique results in the larger actively controlled switches $SR_{N/A}$ conducting during both the energy transfer interval (D, +/−) and the freewheeling interval (1-D, +/−) under heavy load conditions as seen in FIG. 2. The smaller actively controlled switches $SR_{N/B}$ conduct during only during the energy transfer interval (D, +/−) under heavy load conditions also as seen in FIG. 2.

Under light load conditions, the larger actively controlled switches $SR_{N/A}$ can be on or off depending on which configuration offers higher efficiency. In FIG. 3, the larger actively controlled switches $SR_{N/A}$ are shown as being off during both the corresponding energy transfer interval (D, +/−) and freewheeling interval (1-D, +/−) under light load conditions. The smaller actively controlled switches $SR_{N/B}$ conduct during the energy transfer interval (D, +/−) under light load conditions also as seen in FIG. 3. This light-load control technique results in gate loss savings compared to standard methods, particularly if the larger actively controlled switches $SR_{N/A}$ are off.

Both the turn on point and turn off point of the control signals $Ctrl_{SR1,2B}$ for the smaller actively controlled switches $SR_{N/B}$ can be determined by the controller 112 as part of normal PWM (pulse width modulation) operation during both full power and light-load conditions. For example, the controller 112 can issue the control signals $Ctrl_{SRN/M}$ based on a PMW signal generated by the controller 112 as part of standard control procedure. The duty cycle of the PWM signal corresponds to the energy transfer interval (D) and 1-D corresponds to the freewheeling interval for each positive/negative cycle of the current being rectified.

In PWM converters, the energy transfer intervals (D, +/−) and correspondingly the freewheeling intervals (1-D, +/−) depend on the input voltage Vin. At low line (low Vin), the duty cycle is maximum which results in the widest energy transfer intervals and shortest freewheeling intervals. At high line (high Vin), the duty cycle is minimum which results in shortest energy transfer intervals and widest freewheeling intervals. In each case, the controller 112 can align the midpoint of the control signal $Ctrl_{SR1,2B}$ for the smaller actively controlled switches $SR_{N/B}$ with the midpoint of the PWM signal to achieve the gate drive waveforms shown in FIGS. 2 and 3. The controller 112 can set the width i.e. duty cycle of $Ctrl_{SR1/2B}$ based on user input stored in memory accessible by the controller 112.

In another embodiment, the controller 112 can align the turn on point of the control signal $Ctrl_{SR1,2B}$ for each smaller actively controlled switch $SR_{N/B}$ with the PWM signal generated by the controller 112 during both full power and light-load conditions. The controller 112 can determine the turn off point of the control signal $Ctrl_{SR1,2B}$ for each smaller actively controlled switch $SR_{N/B}$ based on an RMS (root mean square) method. In one embodiment, the controller 112 calculates an RMS measure of current delivered by the power converter to the load. For example, a current divider for each small actively controlled switch $SR_{N/B}$ has the following formulation:

$$k_{sm} = \frac{R_{ds,lrg}}{R_{ds,lrg} + R_{ds,sm}} \quad (1)$$

where $R_{ds,sm}$ is the on-state resistance of that small actively controlled switch $SR_{N/B}$ and $R_{ds,lrg}$ is the on-state resistance of the large actively controlled switch $SR_{N/A}$ coupled in parallel with the small actively controlled switch. A current divider for each large actively controlled switch $SR_{N/A}$ has a similar formulation as given by:

$$k_{sm} = \frac{R_{ds,sm}}{R_{ds,lrg} + R_{ds,sm}} \quad (2)$$

RMS current of each small actively controlled switch $SR_{N/B}$ is then given by:

$$I_{RMS,sm} = \sqrt{\frac{D}{2} k_{sm} \left( I_o^2 + \frac{\Delta I^2}{12} \right)} \quad (3)$$

and the RMS current of the large actively controlled switch $SR_{N/A}$ coupled in parallel with that small actively controlled switch $SR_{N/B}$ is given by:

$$I_{RMS,lrg} = \sqrt{\left( I_o^2 + \frac{\Delta I^2}{12} \right) \frac{\sqrt{1 - D(1 - 2k_{lrg})}}{2}} \quad (4)$$

where $I_O$ is the DC output current and $\Delta I$ is ripple current of the output inductor $L_O$.

The controller 112 activates the control signal $Ctrl_{SR1/2B}$ for each smaller actively controlled switch $SR_{N/B}$ at the beginning of the corresponding (+/−) energy transfer interval. The controller 112 deactivates the control signal responsive to the RMS measure of current delivered by the power converter to the load reaching an RMS limit defined for that small actively controlled switch $SR_{N/B}$.

Figure 4:
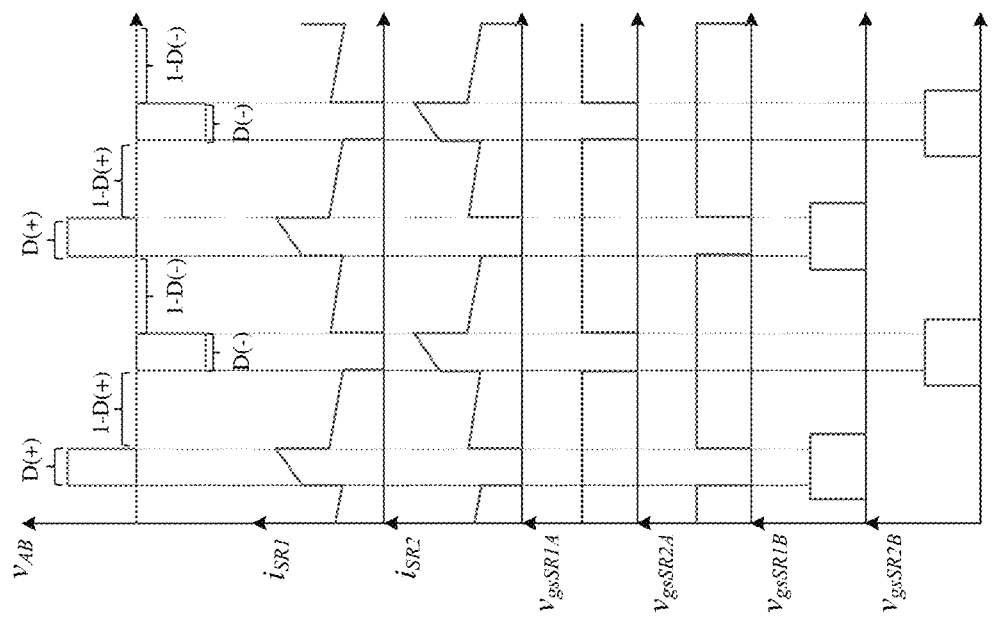
FIG. 4 illustrates various waveforms associated with operation of the power converter shown in FIG. 1 during full power conditions at the load.
Figure 5:
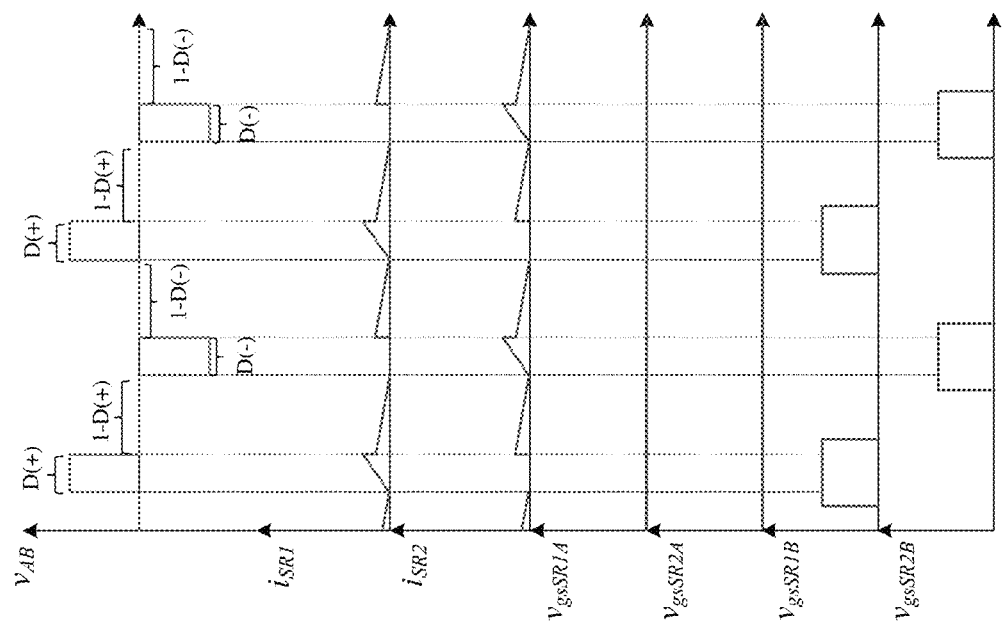
FIG. 5 illustrates various waveforms associated with operation of the power converter shown in FIG. 1 at the critical conduction condition.

In another embodiment, the controller 112 activates the control signal $Ctrl_{SR1/2B}$ for each smaller actively controlled switch $SR_{N/B}$ prior the beginning of the corresponding (+/−) energy transfer interval and deactivates $Ctrl_{SR1/2B}$ after the end of that energy transfer interval during full power and/or light-load conditions at the load. FIGS. 4 and 5, which include the same waveforms as shown in FIGS. 2 and 3, illustrate this embodiment.

FIG. 4 shows the waveforms during full power conditions at the load, and FIG. 5 shows the same waveforms during low power conditions at the load or so-called light-load conditions. According to this embodiment, the controller 112 activates or deactivates the control signal $Ctrl_{SR1,2A}$ for each larger actively controlled switch $SR_{N/A}$ for both the corresponding (+/−) energy transfer interval and freewheeling interval during low power conditions at the load as shown in FIG. 5. The controller 112 also activates the control signal $Ctrl_{SR1/2B}$ for each respective smaller actively controlled switch $SR_{N/B}$ prior the beginning of the corresponding (+/−) energy transfer interval and deactivates $Ctrl_{SR1/2B}$ after the end of that energy transfer interval during low power conditions at the load. That is, under both full power and light-load conditions at the load, the control signal $Ctrl_{SR1,2B}$ for each smaller actively controlled switch $SR_{N/B}$ can have a greater width (i.e. duty cycle) than the corresponding (+/−) energy transfer interval as shown in FIG. 4 (full-power) and FIG. 5 (light-load). In one embodiment, the controller 112 activates the control signal $Ctrl_{SR1,2B}$ for each respective smaller actively controlled switch $SR_{N/B}$ for at least part of the corresponding (+/−) freewheeling interval during low power conditions at the load if an RMS limit defined for that smaller actively controlled switch $SR_{N/B}$ is not expected to be exceeded as previously described herein.

According to this embodiment, the larger actively controlled switches $SR_{N/A}$ conduct during the energy transfer (D, +/−) and freewheeling (1-D, +/−) intervals under full power conditions at the load. The smaller actively controlled switches $SR_{N/B}$ conduct for some fixed amount of time during the full power conditions, shown as greater than the corresponding (+/−) energy transfer interval D in FIG. 4. FIG. 5 shows the critical conduction current condition in which the inductor $L_O$ current reaches zero and the lowest current where the synchronous rectifiers 106, 108 can continuously conduct longer than the energy transfer interval D (+/−) without affecting output voltage ripple. Under these conditions, the larger actively controlled switches $SR_{N/A}$ are off and typically would be disabled at a current greater than the critical current. The smaller actively controlled switches $SR_{N/B}$ conduct for the fixed amount time determined by the controller 112.

Figure 6:
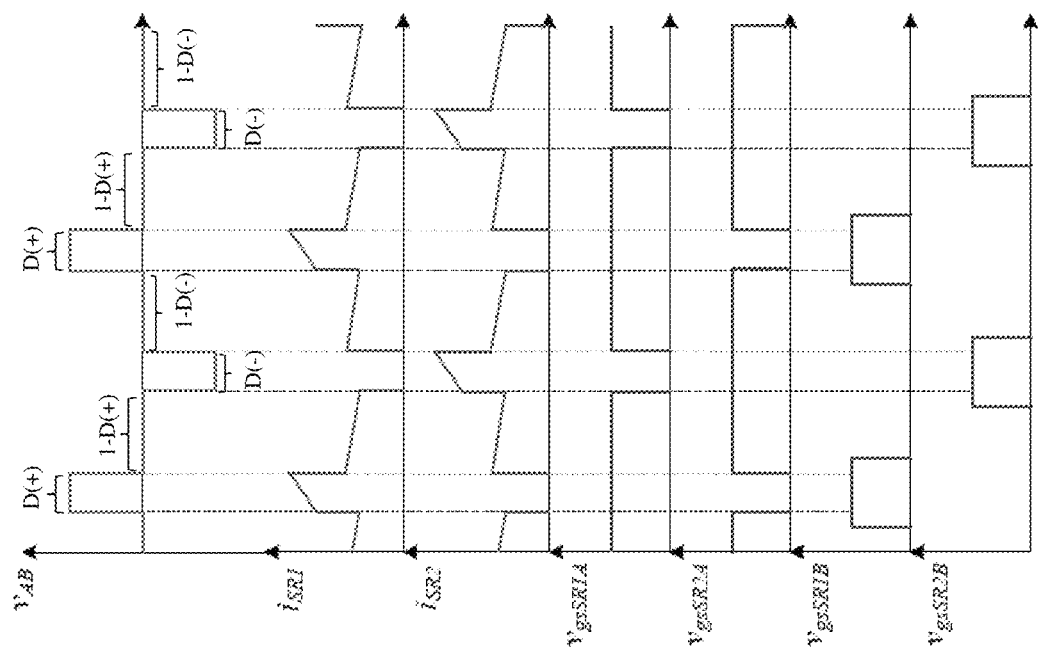
FIG. 6 illustrates various waveforms associated with operation of the power converter shown in FIG. 1 below the critical conduction condition.

FIG. 6 illustrates the case in which the power converter operates below the critical conduction condition. Here, the controller 112 reduces the switching frequency Fsw so as to implement burst mode. In burst mode, the larger actively controlled switches $SR_{N/A}$ are off and the controller 112 switches the smaller actively controlled switches $SR_{N/B}$ at least for the corresponding (+/−) energy transfer interval D. Or as shown in FIG. 6, actively controlled switch $SR_{1B}$ can switch for D/2 (it's energy transfer interval) and actively controlled switch $SR_{2B}$ switches for the fixed on time as before. Some conventional approaches use diodes to conduct at this point because the gate charge penalty overshadows the conduction savings. However, with the asymmetric design approach described herein wherein smaller and larger actively controlled switches $SR_{N/M}$ are coupled in parallel within the same synchronous rectifier 106/108, light-load efficiency is improved.

Again returning to the exemplary power converter embodiment shown in FIG. 1, each synchronous rectifier 106, 108 has two actively controlled switches $SR_{N/M}$ coupled in parallel and with different current-carrying capacities. The controller 112 can utilize the asymmetric synchronous rectifier design to accommodate medium power conditions at the load, the medium power conditions being between full-power and light-load conditions.

Figure 7:
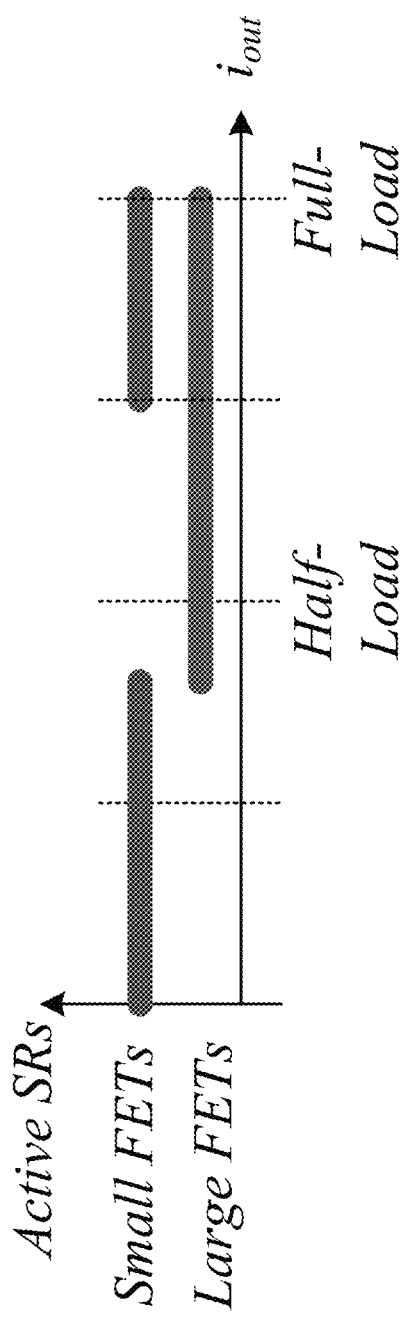
FIG. 7 illustrates one embodiment in which the controller of the power converter shown in FIG. 1 activates the synchronous rectifier control signals differently for high, medium and low power conditions at the load.

FIG. 7 illustrates one embodiment in which the controller 112 activates the control signals $Ctrl_{SR1/2A}$ for the respective larger actively controlled switches $SR_{N/A}$ for both the energy transfer and freewheeling intervals of the corresponding current (+/−) cycle during the medium power conditions at the load ('Half-load'). The controller 112 deactivates the control signals $Ctrl_{SR1/2B}$ for the respective smaller actively controlled switches $SR_{N/B}$ for both the energy transfer and freewheeling intervals of the corresponding current (+/−) cycle during the medium power conditions at the load. This way, at heavy load (Full-load)), both the large and small actively controlled switches $SR_{N/M}$ are on. As the load reduces, only larger actively controlled switches $SR_{N/A}$ conduct. Below a certain load point, only the smaller actively controlled switches conduct $SR_{N/B}$. The controller 112 can determine the on-time of the smaller actively controlled switches $SR_{N/B}$ according to any of the embodiments previously described herein. The controller 112 can implement even finer power level control than the 3-level control shown in FIG. 7.

FIG. 8 illustrates an embodiment in which the controller 112 modulates the on-time of the large and small actively controlled switches $SR_{N/M}$ according to the load conditions to achieve finer power level control than the 3-level control. As the load decreases, the larger actively controlled switches $SR_{N/A}$ go from full conduction (Full) during each respective half cycle (+/−) at full power conditions to non-conducting (Off) at the lowest power conditions. The smaller actively controlled switches $SR_{N/B}$ go from conduction during only the energy transfer interval (D/2) of each respective half cycle (+/−) to greater conduction (D/2+X %) at lower power conditions to full conduction (Full) during each respective half cycle (+/−) at even lower power conditions. At the lowest power conditions, the smaller actively controlled switches $SR_{N/B}$ can be set back to conduction during only the energy transfer interval (D/2) of each respective half cycle (+/−).

The asymmetric synchronous rectifier design approach previously described herein can be extended to resonant converters. The operating principles of a resonant converter are different than those of the PWM converter previously described herein. For example, variable frequency control applies to resonant converters. As the input voltage Vin changes, the switching frequency (Fsw) varies to maintain regulation (proportional). Similarly as the load changes, Fsw varies to maintain regulation (inversely proportional). Also in resonant converters, there is no freewheeling interval. Instead, the resonant current is rectified and the average value is provided to the load while the AC component is filtered by the output capacitor $C_O$. As such, each synchronous rectifier of a resonant converter rectifies during one half cycle and stays off for the other half cycle. In this case, each synchronous rectifier only operates for its energy transfer interval (equal to a half cycle), and then is off because there is no freewheeling interval.

To apply the asymmetric design approach previously described herein for PWM converters to resonant converters, the smaller actively controlled switches of the synchronous rectifiers are controlled so as to conduct for a portion of the half cycle (e.g. beginning, middle or end) and the larger actively controlled switches at controlled so as to conduct under heavy load or full power conditions at the load where on-time is based on safe operation. The same principles previously described herein for PWM converters are applied to a resonant converter: as the load reduces, load sharing among the actively controlled switches changes until only the smaller switches conducts at light-load conditions.

Figure 9:
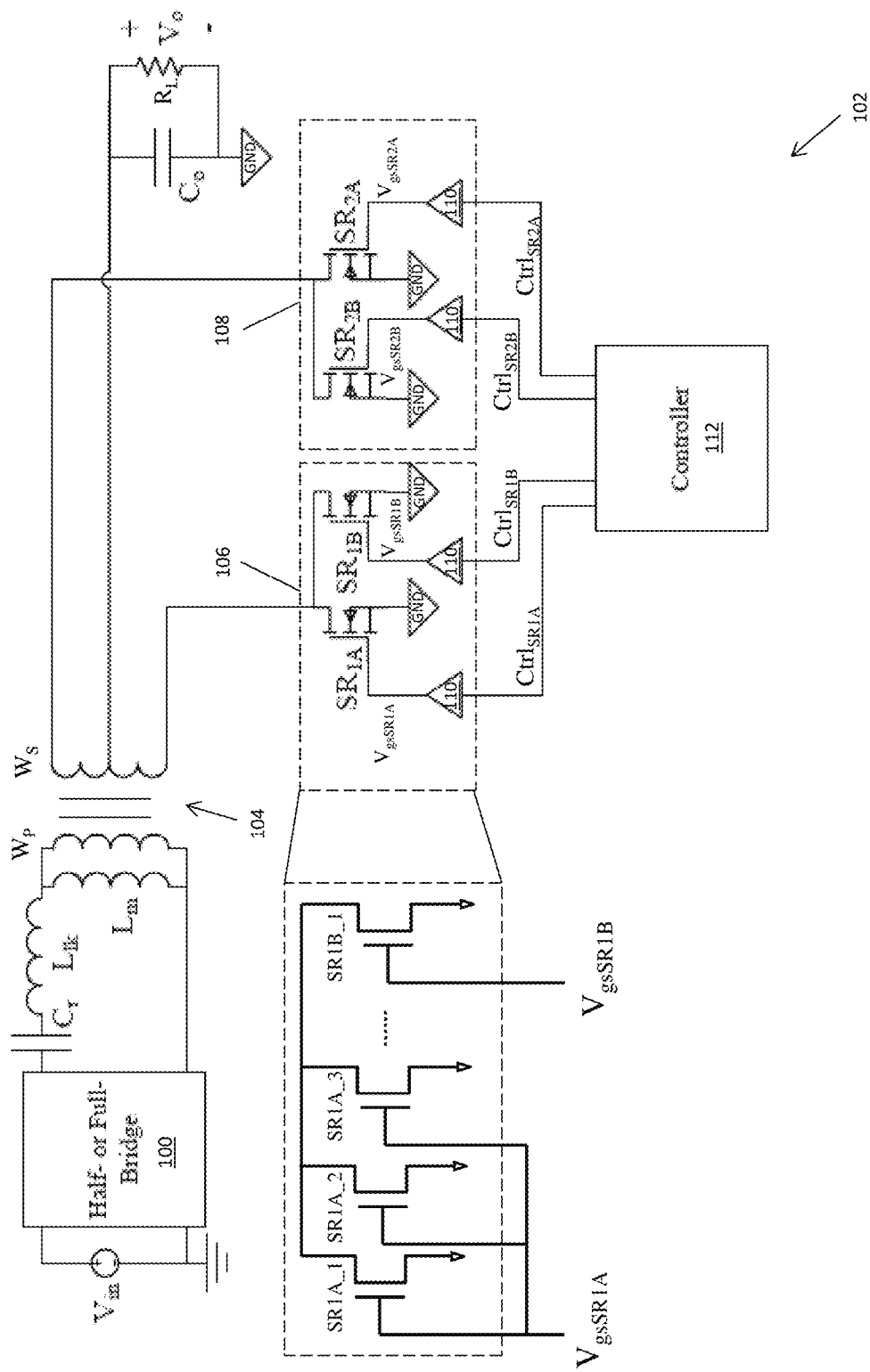
FIG. 9 illustrates a block diagram of an embodiment of a resonant LLC converter having an asymmetric synchronous rectifier design.

FIG. 9 illustrates an embodiment of a resonant converter having asymmetric synchronous rectifier design as previously described herein. According to this embodiment, the resonant converter is an LLC converter. The LLC converter includes a capacitor Cr and two inductors Llk, Lm coupled between the half or full bridge circuit 100 and the primary winding $W_P$ of the transformer 104.

Figure 10:
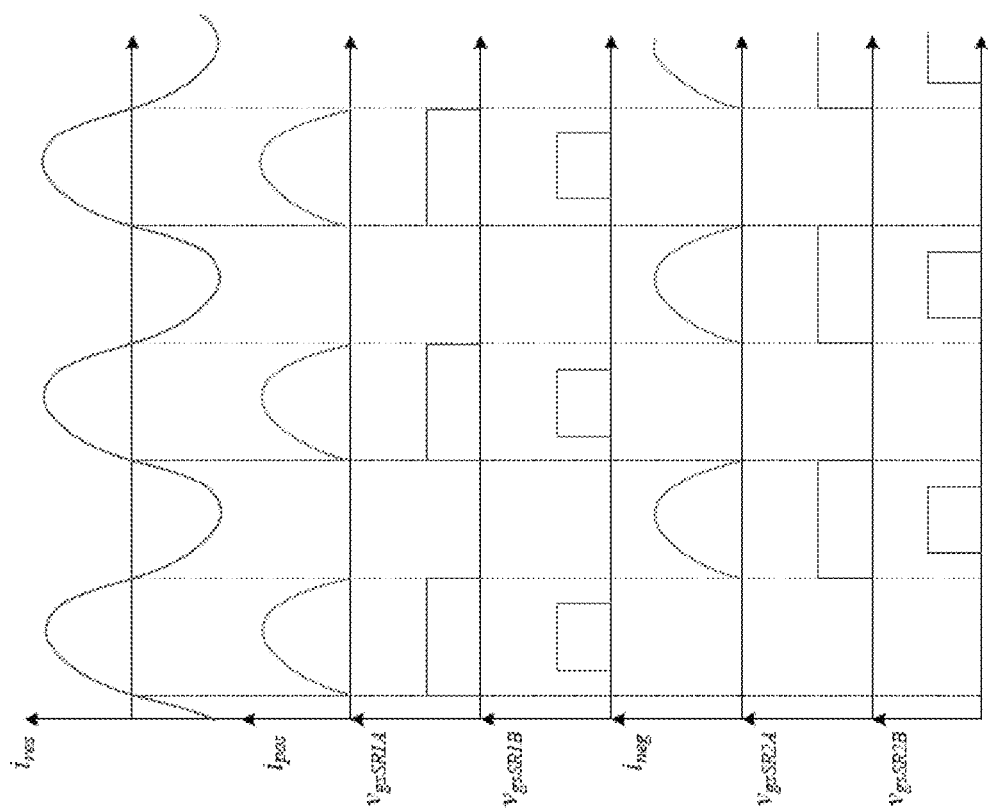
FIG. 10 illustrates various waveforms associated with operation of the resonant LLC converter shown in FIG. 9.

FIG. 10 illustrates various waveforms associated with operation of the resonant LLC converter shown in FIG. 9. FIG. 10 includes the same synchronous rectifier gate drive waveforms $V_{gsSRN/M}$ as shown in FIGS. 2 and 3. FIG. 10 also illustrates the resonant current Ores) i.e. the current in inductor Llk, the positive cycle portion ($i_{pos}$) of the resonant current rectified by the first synchronous rectifier 106 during the positive half cycle and the negative cycle portion ($i_{neg}$) of the resonant current rectified by the second synchronous rectifier 108 during the negative half cycle. The controller 112 activates the gate drive signals $V_{gsSRN/A}$ for the larger actively controlled switches $SR_{N/A}$ for the entire corresponding half (positive or negative) cycle. The controller 112 centers the gate drive signals $V_{gsSRN/B}$ for the smaller actively controlled switches $SR_{N/B}$ on the corresponding resonant current ($i_{pos}$ or $i_{neg}$).

Each switching cycle of each synchronous rectifier 106, 108 has a variable switching frequency (Fsw) determined by the controller 112 based on changes at the input power source and changes at the load. The controller 112 decreases Fsw during full power conditions at the load, activates control signals $Ctrl_{SR1/2A}$ for the respective half (positive or negative) of the switching cycle during the full power conditions at the load, and activates control signals $Ctrl_{SR1/2B}$ for less than the respective half (positive or negative) of the switching cycle during the full power conditions at the load to achieve the gate drive signal waveforms shown in FIG. 10.

The timing and duty cycle of the control signals $Ctrl_{SRN/M}$ for the actively controlled switches $SR_{N/M}$ can be determined by the controller 112 according to any of the embodiments previously described herein. For example, the controller 112 can activate $Ctrl_{SR1/2B}$ at the beginning of the corresponding half (positive or negative) of the switching cycle and deactivate $Ctrl_{SR1/2B}$ at less than half the switching cycle during the full power conditions at the load. The controller 112 can calculate an RMS measure of current delivered by the resonant LLC converter, activate $Ctrl_{SR1/2B}$ at the beginning of the corresponding half (positive or negative) of the switching cycle, and deactivate $Ctrl_{SR1/2B}$ responsive to the RMS measure of current reaching an RMS limit defined for the corresponding actively controlled switch $SR_{N/B}$.

The controller 112 can increase the variable switching frequency (Fsw) of a driving bridge circuit corresponding to the switching frequency of the synchronous rectifiers 106, 108 during low power conditions at the load, deactivate $Ctrl_{SR1/2A}$ for the entire switching cycle during the low power conditions at the load, and activate $Ctrl_{SR1/2B}$ for up to the respective half (positive or negative) of the switching cycle during the low power conditions at the load. The controller 112 can activate $Ctrl_{SR1/2A}$ for the respective half (positive or negative) of the switching cycle during medium power conditions at the load, and deactivate $Ctrl_{SR1/2B}$ for the entire switching cycle during the medium power conditions at the load.

Figure 11:
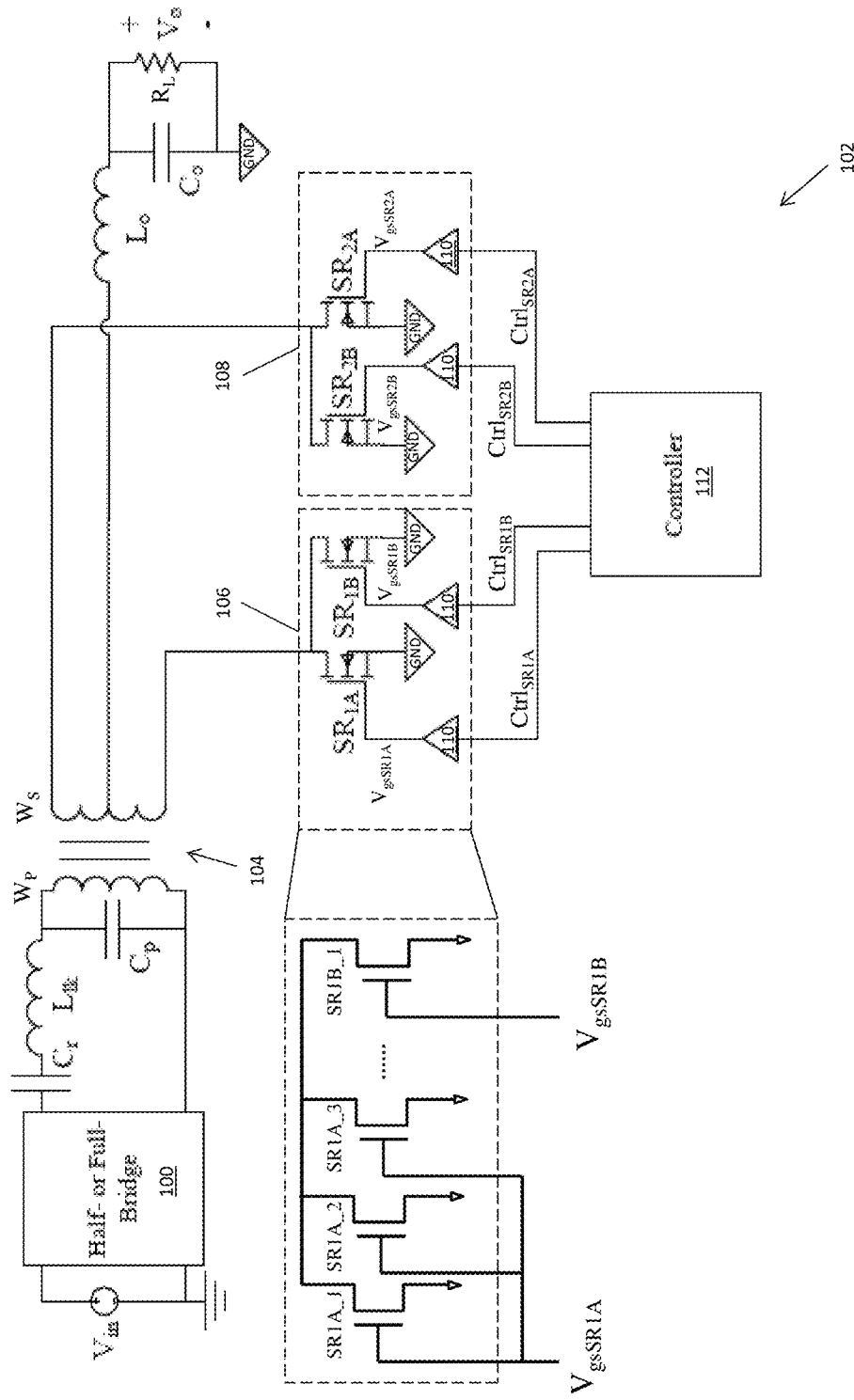
FIG. 11 illustrates a block diagram of an embodiment of a voltage-type resonant converter having an asymmetric synchronous rectifier design.

FIG. 11 illustrates another embodiment of a resonant converter having asymmetric synchronous rectifier design as previously described herein. The embodiment shown in FIG. 11 is similar to the embodiment shown in FIG. 9. Different, however, the converter is a voltage-type resonant converter where inductor Lm in FIG. 9 is replaced with a capacitor Cp in parallel with the primary winding $W_P$ of the transformer 104.

Figure 12:
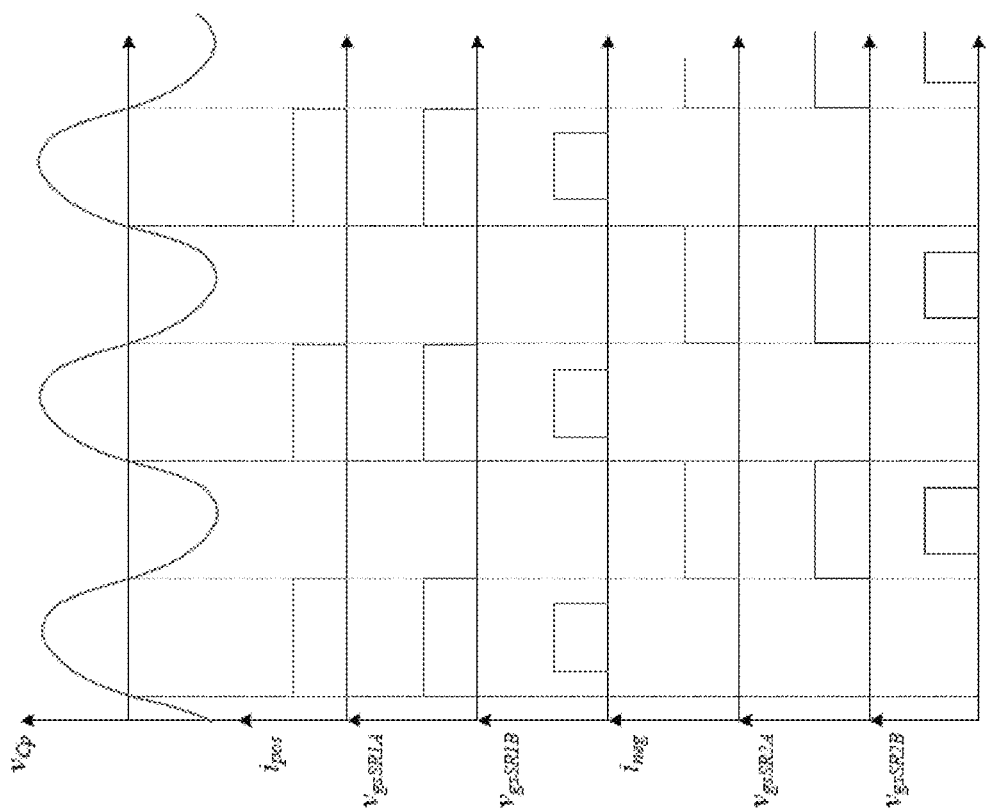
FIG. 12 illustrates various waveforms associated with operation of the voltage-type resonant converter shown in FIG. 11.

FIG. 12 illustrates various waveforms associated with operation of the voltage-type resonant converter shown in FIG. 11. FIG. 12 includes the same waveforms shown in FIG. 10. The voltage-type resonant converter is a series-parallel resonant converter in that the resonant voltage ($V_{Cp}$) across capacitor Cp is rectified and filtered. The rectified current is therefore a square-wave, as indicated in FIG. 12 by the positive cycle portion ($i_{pos}$) and the negative cycle portion ($i_{neg}$) of the resonant current being rectified by the respective synchronous rectifiers 106, 108. The gate drive signals $V_{gsSRN/B}$ for the smaller actively controlled switches $SR_{N/B}$ are still shown as centered. However, since the current is constant, the RMS value is determined by the on-time of the switch $SR_{N/B}$ independent of where in the half (positive or negative) cycle it is positioned. The timing and duty cycle of the corresponding control signals $Ctrl_{SRN/M}$ for the actively controlled switches $SR_{N/A}$ can be determined by the controller 112 according to any of the embodiments previously described herein.

The asymmetric design approach previously described herein also can be extended to buck converters which have a non-isolated topology i.e. no transformer coupling the input power source to the load. In the case of a buck converter, the synchronous rectifier forms the low-side switch of the buck converter and conducts only for the freewheeling interval. The high-side switch conducts for the energy transfer interval.

Figure 13:
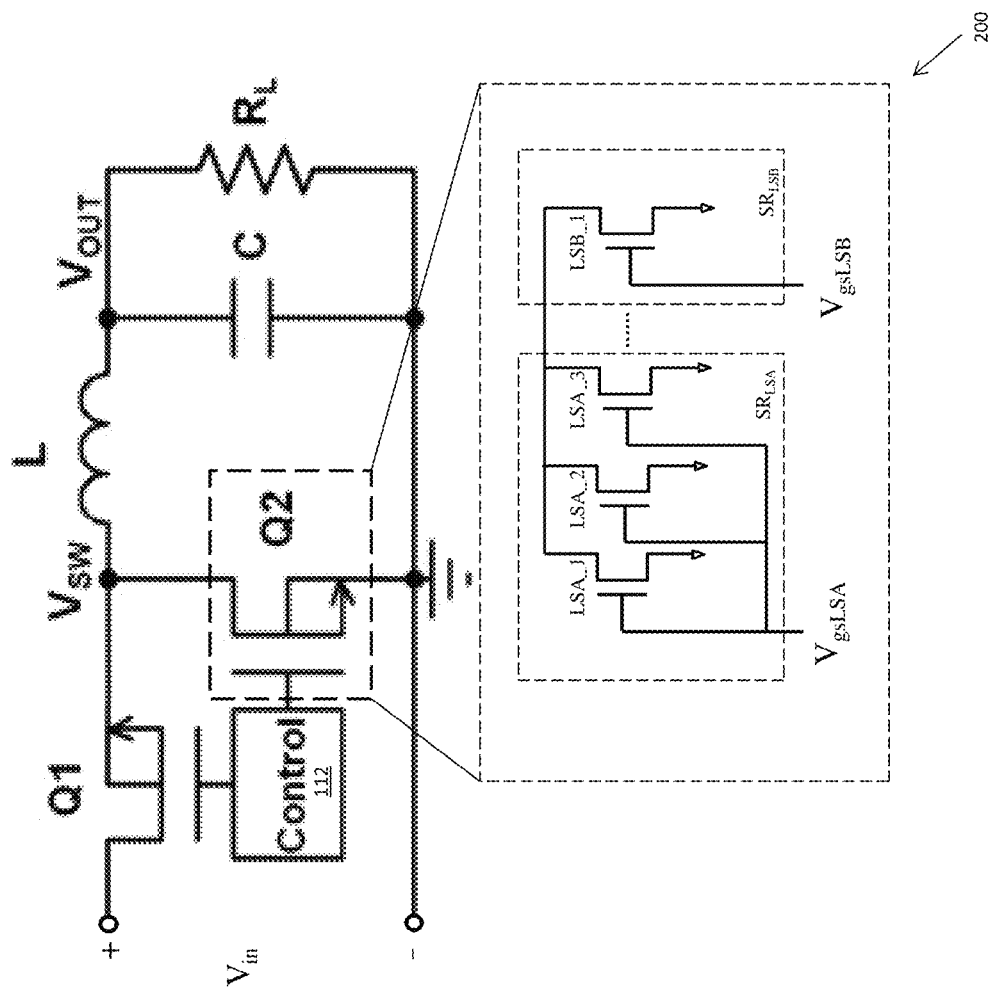
FIG. 13 illustrates a block diagram of an embodiment of a buck converter having an asymmetric synchronous rectifier design.

FIG. 13 illustrates an embodiment of a buck converter having asymmetric synchronous rectifier design as previously described herein. The buck converter includes a high-side switch Q1 for coupling the input power source Vin to the load $R_L$ through an inductor L when the high-side switch Q1 is on. A synchronous rectifier 200 having an asymmetric design as previously described herein is configured as the low-side switch Q1 of the buck converter, for coupling the load to ground (GND) through the inductor when the low-side switch Q1 is on. The synchronous rectifier 200 in FIG. 13 is shown with at least three transistors LSA_1, LSA_2, LSA_3 coupled in parallel to form a first (larger) actively controlled switch $SR_{LSA}$ of the synchronous rectifier 200 and controlled by the same gate drive signal $V_{gsLSA}$, and a single transistor LSB_1 controlled by gate drive signal $V_{gsLSB}$ which forms a second (smaller) actively controlled switch $SR_{LSB}$ of the synchronous rectifier 200. As such, the actively controlled switches $SR_{LSA/B}$ of the synchronous rectifier 200 have different current-carrying capacities. This asymmetry can be realized according to any of the asymmetric synchronous rectifier design embodiments described herein.

Figure 14:
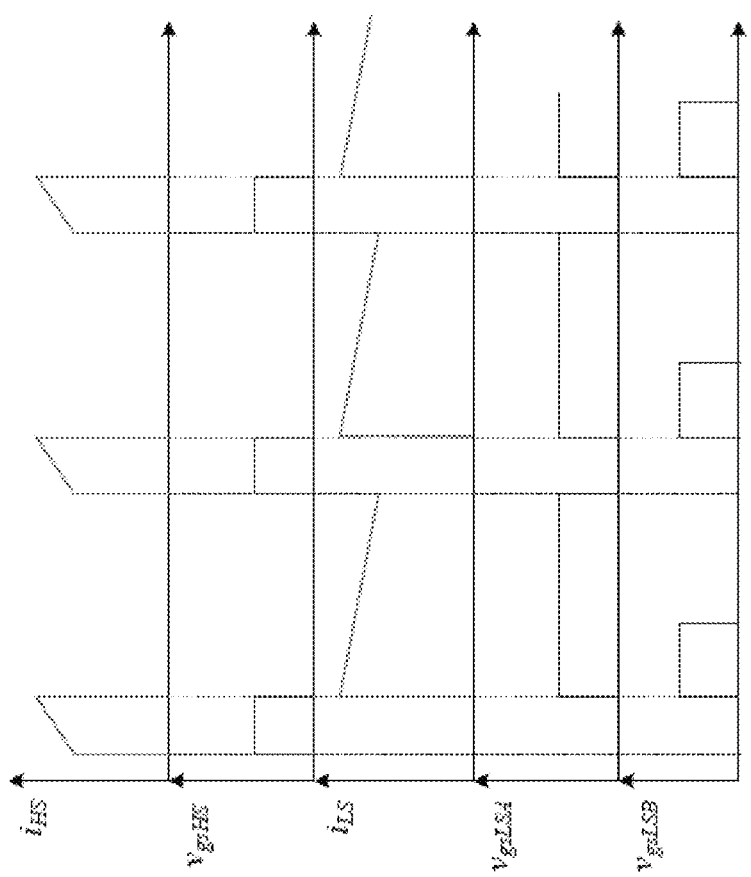
FIG. 14 illustrates various waveforms associated with operation of the buck converter shown in FIG. 13.

FIG. 14 illustrates various waveforms associated with operation of the buck converter shown in FIG. 13. The waveforms include the high-side current ($i_{HS}$), the gate signal ($V_{gsHS}$) applied to the gate of the high-side switch Q1, the low-side current ($i_{LS}$), the gate signal ($V_{gsLSA}$) applied to the gate of the larger actively controlled switch $SR_{LSA}$ of the synchronous rectifier 200, and the gate signal ($V_{gsLSB}$) applied to the gate of the smaller actively controlled switch $SR_{LSB}$ of the synchronous rectifier 200. Each switching cycle of the buck converter has an energy transfer period during which the high-side switch Q1 is on and the low-side switch Q2 is off, and a freewheeling period during which the high-side switch Q1 is off and the low-side switch Q2 is on. During each freewheeling period, the controller 112 activates $V_{gsLSA}$ for the entire freewheeling period and activates $V_{gsLSB}$ for only part of the freewheeling period. This way, the larger actively controlled switch $SR_{LSA}$ of the synchronous rectifier 200 conducts for the entire freewheeling period and the smaller actively controlled switch $SR_{LSB}$ conducts for only part of the entire freewheeling period.

The timing and duty cycle of the control signal $V_{gsLSB}$ for the smaller actively controlled switch $SR_{LSB}$ can be determined by the controller 112 according to any of the embodiments previously described herein. For example, the controller 112 can activate $V_{gsLSB}$ at the beginning of each freewheeling period and deactivate $V_{gsLSB}$ before the end of each freewheeling period as shown in FIG. 14. The controller 112 can calculate an RMS measure of current delivered by the buck converter to the load, and activate $V_{gsLSB}$ at the beginning of each freewheeling period and deactivate $V_{gsLSB}$ responsive to the RMS measure of current delivered by the buck converter to the load reaching an RMS limit defined for the smaller actively controlled switch $SR_{LSB}$ of the synchronous rectifier 200.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A synchronous rectifier circuit, comprising:
a plurality of actively controlled switches coupled in parallel;
a plurality of gate drivers each having an input terminal for receiving a control signal and an output terminal coupled to a gate of one of the actively controlled switches, each gate driver configured to drive the actively controlled switch coupled to its output terminal responsive to the control signal received at its input terminal; and
a controller operable to provide a first control signal to a first one of the gate drivers and provide a second control signal to a second one of the gate drivers, the first control signal being a different control signal than the second control signal so that the actively controlled switch driven by the first gate driver is controllable separately from the actively controlled switch driven by the second gate driver,
wherein each actively controlled switch comprises one or more transistors in parallel,
wherein the actively controlled switch driven by the second gate driver comprises fewer transistors in parallel than the actively controlled switch driven by the first gate driver, so that the actively controlled switch driven by the first gate driver has a higher current rating than the actively controlled switch driven by the second gate driver.

2. The synchronous rectifier circuit of claim 1, wherein the actively controlled switch driven by the first gate driver is disposed in a first power transistor die, and wherein the actively controlled switch driven by the second gate driver is disposed in a second power transistor die.

3. A power converter, comprising:
an input power source;
a synchronous rectifier comprising a plurality of actively controlled switches coupled in parallel and configured to rectify current delivered from the input power source to a load; and
a controller operable to issue a first control signal for driving a first one of the actively controlled switches and issue a second control signal for driving a second one of the actively controlled switches, the first control signal being a different control signal than the second control signal so that the first actively controlled switch is controllable separately from the second actively controlled switch,
wherein the first actively controlled switch has a higher current-carrying capacity than the second actively controlled switch,
wherein each actively controlled switch comprises one or more transistors in parallel,
wherein the second actively controlled switch comprises fewer transistors in parallel than the first actively controlled switch, so that the first actively controlled switch has a higher current rating than the second actively controlled switch.

4. The power converter of claim 3,
wherein the power converter is a buck converter comprising a high-side switch configured to couple the input power source to the load through an inductor when the high-side switch is on,
wherein the synchronous rectifier is configured as a low-side switch of the buck converter for coupling the load to ground through the inductor when the low-side switch is on,
wherein each switching cycle of the buck converter has an energy transfer period during which the high-side switch is on and the low-side switch is off, and a freewheeling period during which the high-side switch is off and the low-side switch is on,
wherein during each freewheeling period, the controller is operable to activate the first control signal for the entire freewheeling period and activate the second control signal for only part of the freewheeling period.

5. The power converter of claim 4, wherein the controller is operable to activate the second control signal at the beginning of each freewheeling period and deactivate the second control signal before the end of each freewheeling period.

6. The power converter of claim 4, wherein the controller is operable to calculate a Root Mean Square (RMS) measure of current delivered by the buck converter, and wherein the controller is operable to activate the second control signal at the beginning of each freewheeling period and deactivate the second control signal responsive to the RMS measure of current delivered by the buck converter to the load reaching an RMS limit defined for the second actively controlled switch.

7. The power converter of claim 3, further comprising:
a transformer for isolating the input power source from the load,
wherein the synchronous rectifier is coupled to a winding of the transformer,
wherein each switching cycle of the synchronous rectifier comprises an energy transfer interval during which the input power source is connected to the winding by the synchronous rectifier and a freewheeling interval during which the input power source is disconnected from the winding by the synchronous rectifier,
wherein the controller is operable to activate the first control signal for both the energy transfer interval and the freewheeling interval during full power conditions at the load,
wherein the controller is operable to activate the second control signal for part or all of the energy transfer interval and for at most part of the freewheeling interval during the full power conditions at the load.

8. The power converter of claim 7, wherein the controller is operable to activate the second control signal at the beginning of the energy transfer interval and deactivate the second control signal at the end of the energy transfer interval during the full power conditions at the load.

9. The power converter of claim 7, wherein the controller is operable to activate the second control signal prior the beginning of the energy transfer interval and deactivate the second control signal after the end of the energy transfer interval during the full power conditions at the load.

10. The power converter of claim 9, wherein the controller is operable to issue the first and the second control signals based on a Pulse Width Modulated (PMW) signal generated by the controller, and wherein a midpoint of the second control signal is aligned with a midpoint of the PWM signal.

11. The power converter of claim 10, wherein a width of the second control signal is set by the controller based on user input stored in memory accessible by the controller.

12. The power converter of claim 7, wherein the controller is operable to calculate a Root Mean Square (RMS) measure of current delivered by the power converter, and wherein the controller is operable to activate the second control signal at the beginning of the energy transfer interval and deactivate the second control signal responsive to the RMS measure of current delivered by the power converter to the load reaching an RMS limit defined for the second actively controlled switch.

13. The power converter of claim 7, wherein the controller is operable to deactivate the first control signal for both the energy transfer interval and the freewheeling interval during low power conditions at the load, and wherein the controller is operable to activate the second control signal for at least the energy transfer interval during the low power conditions at the load.

14. The power converter of claim 13, wherein the controller is operable to activate the second control signal for at least part of the freewheeling interval during the low power conditions at the load if an RMS limit defined for the second actively controlled switch is not expected to be exceeded.

15. The power converter of claim 13, wherein the controller is operable to activate the first control signal for both the energy transfer interval and the freewheeling interval during medium power conditions at the load, and wherein the controller is operable to deactivate the second control signal for both the energy transfer interval and the freewheeling interval during the medium power conditions at the load.

16. The power converter of claim 3, further comprising:
a transformer for isolating the input power source from the load,
wherein the synchronous rectifier is coupled to a winding of the transformer,
wherein the power converter is a resonant converter,
wherein each switching cycle of the synchronous rectifier has a variable switching frequency determined by the controller based on changes at the input power source and changes at the load, wherein the controller is operable to decrease the variable switching frequency of the synchronous rectifier during full power conditions at the load, wherein the controller is operable to activate the first control signal for half the switching cycle during the full power conditions at the load, wherein the controller is operable to activate the second control signal for less than half the switching cycle during the full power conditions at the load.

17. The power converter of claim 16, wherein the controller is operable to activate the second control signal at the beginning of the switching cycle and deactivate the second control signal at less than half the switching cycle during the full power conditions at the load.

18. The power converter of claim 16, wherein the controller is operable to calculate a Root Mean Square (RMS) measure of current delivered by the power converter, and wherein the controller is operable to activate the second control signal at the beginning of the switching cycle and deactivate the second control signal responsive to the RMS measure of current delivered by the power converter to the load reaching an RMS limit defined for the second actively controlled switch.

19. The power converter of claim 16, wherein the controller is operable to increase the variable switching frequency of the synchronous rectifier during low power conditions at the load, wherein the controller is operable to deactivate the first control signal for the entire switching cycle during the low power conditions at the load, and wherein the controller is operable to activate the second control signal for up to half the switching cycle during the low power conditions at the load.

20. The power converter of claim 19, wherein the controller is operable to activate the first control signal for half the switching cycle during medium power conditions at the load, and wherein the controller is operable to deactivate the second control signal for the entire switching cycle during the medium power conditions at the load.

21. The power converter of claim 3, wherein the first actively controlled switch is disposed in a first power transistor die, and wherein the second actively controlled switch is disposed in a second power transistor die.

22. A power converter, comprising:
an input power source;
a synchronous rectifier comprising a plurality of actively controlled switches coupled in parallel and configured to rectify current delivered from the input power source to a load; and
a controller operable to issue a first control signal for driving a first one of the actively controlled switches and issue a second control signal for driving a second one of the actively controlled switches, the first control signal being a different control signal than the second control signal so that the first actively controlled switch is controllable separately from the second actively controlled switch,
wherein the first actively controlled switch has a higher current-carrying capacity than the second actively controlled switch,
wherein the power converter is a buck converter comprising a high-side switch configured to couple the input power source to the load through an inductor when the high-side switch is on,
wherein the synchronous rectifier is configured as a low-side switch of the buck converter for coupling the load to ground through the inductor when the low-side switch is on, wherein each switching cycle of the buck converter has an energy transfer period during which the high-side switch is on and the low-side switch is off, and a freewheeling period during which the high-side switch is off and the low-side switch is on, wherein during each freewheeling period, the controller is operable to activate the first control signal for the entire freewheeling period and activate the second control signal for only part of the freewheeling period.

23. The power converter of claim 22, wherein the controller is operable to activate the second control signal at the beginning of each freewheeling period and deactivate the second control signal before the end of each freewheeling period.

24. The power converter of claim 22, wherein the controller is operable to calculate a Root Mean Square (RMS) measure of current delivered by the buck converter, and wherein the controller is operable to activate the second control signal at the beginning of each freewheeling period and deactivate the second control signal responsive to the RMS measure of current delivered by the buck converter to the load reaching an RMS limit defined for the second actively controlled switch.

25. A power converter, comprising:
an input power source;
a synchronous rectifier comprising a plurality of actively controlled switches coupled in parallel and configured to rectify current delivered from the input power source to a load;
a transformer for isolating the input power source from the load; and
a controller operable to issue a first control signal for driving a first one of the actively controlled switches and issue a second control signal for driving a second one of the actively controlled switches, the first control signal being a different control signal than the second control signal so that the first actively controlled switch is controllable separately from the second actively controlled switch,
wherein the first actively controlled switch has a higher current-carrying capacity than the second actively controlled switch,
wherein the synchronous rectifier is coupled to a winding of the transformer,
wherein the power converter is a resonant converter,
wherein each switching cycle of the synchronous rectifier has a variable switching frequency determined by the controller based on changes at the input power source and changes at the load,
wherein the controller is operable to decrease the variable switching frequency of the synchronous rectifier during full power conditions at the load,
wherein the controller is operable to activate the first control signal for half the switching cycle during the full power conditions at the load,
wherein the controller is operable to activate the second control signal for less than half the switching cycle during the full power conditions at the load.

26. The power converter of claim 25, wherein the controller is operable to calculate a Root Mean Square (RMS) measure of current delivered by the power converter, and wherein the controller is operable to activate the second control signal at the beginning of the switching cycle and deactivate the second control signal responsive to the RMS measure of current delivered by the power converter to the load reaching an RMS limit defined for the second actively controlled switch.

27. The power converter of claim 25, wherein the controller is operable to increase the variable switching frequency of the synchronous rectifier during low power conditions at the load, wherein the controller is operable to deactivate the first control signal for the entire switching cycle during the low power conditions at the load, and wherein the controller is operable to activate the second control signal for up to half the switching cycle during the low power conditions at the load.

28. The power converter of claim 27, wherein the controller is operable to activate the first control signal for half the switching cycle during medium power conditions at the load, and wherein the controller is operable to deactivate the second control signal for the entire switching cycle during the medium power conditions at the load.

29. The power converter of claim 25, wherein the controller is operable to activate the second control signal at the beginning of the switching cycle and deactivate the second control signal at less than half the switching cycle during the full power conditions at the load.

* * * * *